United States Patent

Oda et al.

[11] Patent Number: 5,330,729
[45] Date of Patent: Jul. 19, 1994

[54] SINGLE CRYSTAL PULLING APPARATUS

[75] Inventors: Michiaki Oda; Koji Mizuishi, both of Annaka, Japan

[73] Assignee: Shin-Etsu Handotai Co., Ltd., Japan

[21] Appl. No.: 833,986

[22] Filed: Feb. 10, 1992

[30] Foreign Application Priority Data

Feb. 15, 1991 [JP] Japan .................................. 3-42168

[51] Int. Cl.[5] .............................................. C30B 15/02
[52] U.S. Cl. ...................................... 117/217; 117/218; 117/932
[58] Field of Search ............. 156/616.4, 616.41, 617.1, 156/618.1, 620.4; 422/249, 254

[56] References Cited

U.S. PATENT DOCUMENTS

| | | | |
|---|---|---|---|
| 4,050,905 | 9/1977 | Swinehart | 156/620.4 |
| 5,096,677 | 3/1992 | Katsuoka et al. | 156/620.4 |
| 5,098,675 | 3/1992 | Matsuo et al. | 156/620.4 |
| 5,135,726 | 8/1992 | Min et al. | 156/616.4 |

*Primary Examiner*—Olik Chadhuri
*Assistant Examiner*—Felisa Garrett
*Attorney, Agent, or Firm*—Whitham & Marhoefer

[57] ABSTRACT

A single crystal pulling apparatus of the Czochralski method type wherein the cylindrical heater is supported not only by the two existing electrodes which are vertically shiftable but also by one or more vertical shafts, which may be electrodes or electrically insulated dummy electrodes; the vertical shafts are capable of shifting vertically in synchronism with the existing two electrodes, and are arranged in a manner such that the existing two electrodes and the vertical shafts are at regular intervals along the bottom circumference of the cylindrical heater.

8 Claims, 3 Drawing Sheets

SINGLE CRYSTAL PULLING APPARATUS

BACKGROUND OF THE INVENTION

The present invention relates to a single crystal pulling apparatus for growing and pulling up a single crystal based on the Czochralski method, and more particularly the invention relates to an improved single crystal pulling apparatus of the kind wherein the heater is adapted to shift vertically.

A single crystal pulling apparatus which adopts the CZ (Czochralski) method consists mainly of a main chamber wherein the single crystal is grown and a pull chamber. In the main chamber are provided such elements as a crucible for containing the polycrystal substance (a raw material such as silicon) to be single-crystallized, a cylindrical heater surrounding the crucible, and a cylindrical thermal insulator (heat shield) surrounding the heater. Beneath the main chamber are provided mechanisms for rotating the crucible about a vertical crucible shaft, on which the crucible is fixedly mounted, to control the uniformity of the heat flux in the molten polycrystal substance during the crystal growing operation. Installed above the main chamber is a towering structure of the pull chamber which is an upright, substantially cylindrical enclosure. An isolation valve is provided between the main chamber and the pull chamber. The single crystal ingot which is grown and raised high in the main chamber is brought up into the pull chamber.

The polycrystal substance charged in the crucible is melted down by the heater to turn into a polycrystal molten liquid, and in this liquid is dipped a seed crystal fixed at the lower end of a pull means such as a wire, and the desired single crystal grows from the seed crystal as the pull means is rotated and drawn up at predetermined rates together with the seed crystal.

In such a conventional single crystal pulling apparatus, if the crucible were held and kept at the original altitude, the surface level of the molten liquid in the crucible would gradually shift downwards relative to the heater as well as the crucible wall with the growth of the single crystal, which results in an undesirable change in the heating condition to which the solid/liquid interface between the grown crystal and the molten liquid is subjected.

Therefore, with the view to maintaining the altitude of the surface level of the molten crystal the crucible shaft is adapted to vertically shift and thereby displace the crucible such that the downward displacement of the melt level (solid-liquid interface) is always compensated for by the measured rise of the crucible; in particular, the crucible is raised at a predetermined rate by means of a drive means.

However, in the conventional single crystal pulling apparatus, the heater is stationary so that when the liquid level shifts downwards relative to the crucible wall and the crucible is lifted, the positional relationship between the heater, the crucible wall and the solid-liquid interface changes, whereby the thermal effects of the heater on the solid-liquid interface changes and this typically results in lowering of the oxygen concentration in the growing single crystal. Thus, in a single crystal ingot grown in a conventional single crystal pulling apparatus, the oxygen concentration distribution in the ingot tends to be such that the closer to the bottom of the ingot the lower the oxygen concentration.

In order to solve this problem, an improved single crystal pulling apparatus was proposed wherein the heater is adapted to shift vertically and this vertical shifting of the heater is controlled to correspond the rise of the crucible.

PROBLEMS THE INVENTION SEEKS TO SOLVE

Now, in a conventional single crystal pulling apparatus, the cylindrical heater 105, as shown in the attached top plan view FIG. 4, has two integrally formed feet which are diagonally opposed to each other, and the heater 105 is supported at these two feet only, that is, it is fixed by two electrodes 108, 108 via the two feet. Thus, when the heater 105 is electrified and expands due to the heat it creates, it is easy to conceive that the circular contour of the heater 105, as seen in FIG. 4, progressively turns elliptical, the diameter passing the two feet becoming the minor axis of the ellipse. Thus, the resulting deformation of the heater 105 is the greatest at the localities designated as a and b in FIG. 4 which are the farthest localities from the feet and which are diagonally opposed to each other and the diameter connecting a and b is orthogonal to the diameter passing the two feet. In recent years, it has been a decided tendency that the diameter of the single crystal ingot produced by the pulling apparatus is increased and this has necessitated commensurate increase in the heater diameter. Now, the greater the diameter of the heater, the greater the localized deformity of the heater; hence the distance between the external wall of the crucible and the internal wall of the heater markedly lacks uniformity throughout the circumference of the heater, said distances at the localities a and b being the greatest. As a result of this non-uniformity, the angular distribution of the temperature in the main chamber, especially in the crucible, lacks uniformity which makes it difficult to grow a defectless single crystal and, furthermore, since the clearance between the heater and the heat shield which surrounds the heater is as small as about 20 mm, the chances are that the heater gets in contact with the heat shield and various problems ensue.

Also, since the heater is made of brittle carbon, even a slight deformity would result in a crack, and especially when the single crystal pulling apparatus is disassembled and assembled it is the carbon heater that is most often broken, and this is chiefly due to the fact that the heater is supported at only two points and the heater is allowed to extensively deform locally.

The present invention was made in view of the above problems, and it is, therefore, an object of the invention to provide a single crystal pulling apparatus which is designed such that even if the cylindrical heater has a large diameter, the localized deformation of the heater due to its thermal expansion is kept to a minimum, and the distance between the heater and the crucible and that between the heater and the heat shield are maintained uniform throughout the circumference of the heater so that the angular distribution of the temperature in the main chamber is rendered uniform; furthermore it is another object of the invention that the inventive apparatus will be such that when electrified and expanded, the heater does not get in contact with the heat shield, and the durability of the heater itself is improved.

SUMMARY OF THE INVENTION

Means to solve the Problems

In order to attain the above objects, the present invention proposes an improved single crystal pulling apparatus of the Czochralski method type wherein a cylindrical heater arranged to encompass a crucible installed in a main chamber is supported at the bottom portion thereof by two vertical electrodes which are vertically and simultaneously shiftable to shift said heater vertically; the improvement consists in that the cylindrical heater is supported at the bottom portion by one or more vertical shaft means, which may be electrodes or electrically insulated dummy electrodes, in addition to the existing two vertical electrodes, the vertical shaft means being capable of shifting vertically in synchronism with the existing two electrodes, and being arranged in a manner such that the existing two electrodes and the vertical shaft means are at regular intervals along the bottom circumference of the cylindrical heater.

In an embodiment, the cylindrical heater consists of a single integral heater unit and the vertical shaft means are all dummy electrodes.

In another embodiment, the cylindrical heater is composed of two or more separate arcuate heater units which are separated from neighboring ones by vertical slits, and each heater is composed of two or more separate arcuate heater.

In still another embodiment, the cylindrical heater is composed of two or more separate arcuate heater units which are separated from neighboring ones by vertically penetrating slits, and each heater unit is supported at the bottom portion thereof by at least two vertical rods selected from said existing two electrodes and said vertical shaft means, two of said at least two vertical rods being electrodes.

Preferably, the existing electrodes and the vertical shaft means are interlocked together in a manner such that they are shifted vertically in one body.

Results of the Invention

According to the invention, in a single crystal pulling apparatus the cylindrical heater is supported by one or more vertical shaft means in addition to the two existing electrodes, and the vertical shaft means are arranged in a manner such that the two electrodes and the vertical shaft means are at regular intervals along the bottom circumference of the cylindrical heater, it is now apparent, therefore, that even in the case of a large-diameter cylindrical heater, the biased deformation of the heater will be restricted by the regularly arranged vertical shaft means and the electrodes, and the distance between the heater and the crucible and that between the heater and the heat shield are maintained uniform throughout of the circumference of the heater. Furthermore, the heat distribution in the main chamber becomes more uniform, and the heater would not deform so far as to contact the heat shield. Since the extent of the deformation of the heater is reduced, the heater does not undergo extensive expansion and shrinkage with the favorable result that the wear of the heater is reduced and the heater is less liable to crack and break and becomes more durable and enjoys longer life.

EMBODIMENTS

An embodiment of the invention will be described with reference to the attached figures.

Figure 1:
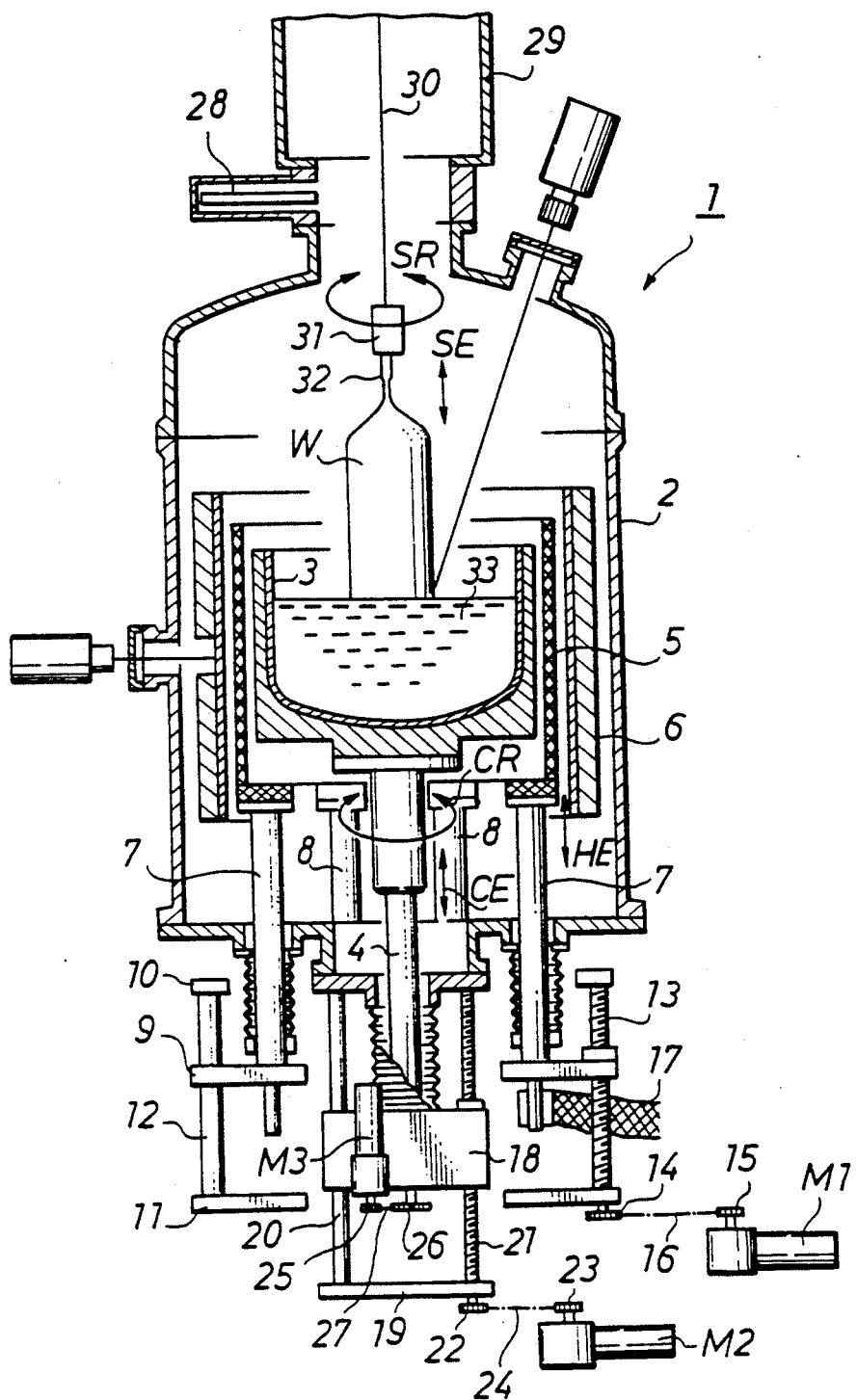
FIG. 1 is a vertical longitudinal sectional drawing showing the construction of a single crystal pulling apparatus according to the invention.

FIG. 1 is a cross-sectional drawing of a single crystal pulling apparatus 1 embodying the invention, wherein reference numeral 2 designates a main chamber (heating chamber) comprising mainly of a stainless cylinder. Inside the main chamber 2 is a crucible assembly which consists of an internal quartz crucible 3 and an external graphite crucible, and is fixed on top of a vertical crucible shaft 4, which is adapted to turn about its axis and shift vertically. Encompassing these crucibles are a cylindrical heater 5 made of carbon and a cylindrical heat shield 6 also made of carbon, the latter 6 surrounding the former 5.

Figure 2:
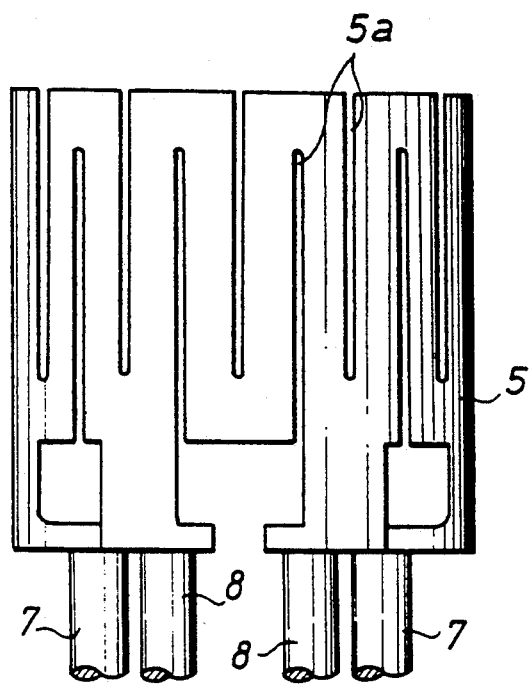
FIG. 2 is a side view of a heater provided in the apparatus of FIG. 1.
Figure 3:
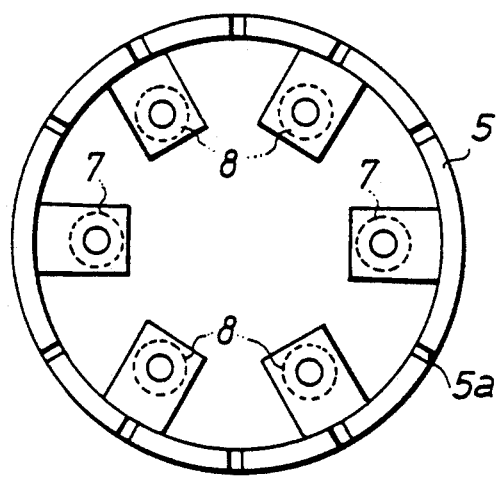
FIG. 3 is a top plan view of the heater of FIG. 2.
Figure 4:
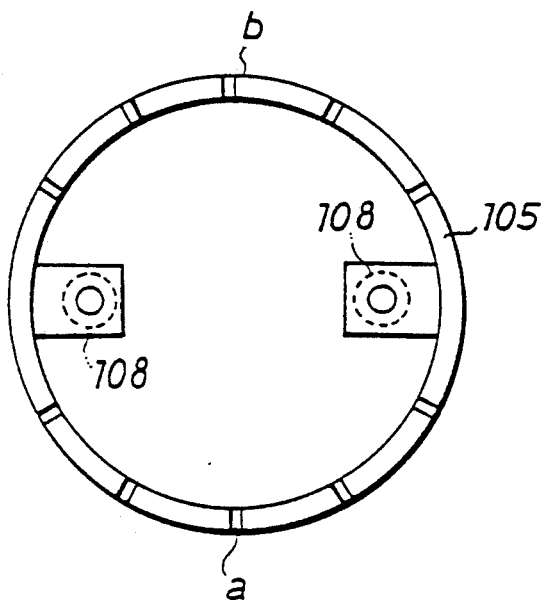
FIG. 4 is a top plan view of a conventional heater.

As shown in FIGS. 2 and 3, the cylindrical heater 5 is formed with a plurality of vertical slits 5a for the purpose of controlling the value of resistance of the heater 5. This heater 5 has six horizontal feet at the bottom and they are fixed at the top of six vertical shafts, respectively, as clearly shown in FIG. 3, of which two are electrodes 7, 7 and four are dummy electrodes 8. The true electrodes 7, 7 are diagonally opposed to each other, and these six shafts are arranged equiangularly about the center of the heater 5, that is, they are arranged at 60° pitch annularly.

Turning back to FIG. 1, the electrodes 7 and dummy electrodes 8 slidably penetrate through the bottom of the main chamber 2, and extend outside the main chamber 2. A horizontal movable ring plate 9 is fixed at a lower portion of the shafts 7, 8. Three vertical guide shafts 12 (only one of them is shown) slidably penetrate the ring plate 9, and are fixed between two stationary ring plates 10 and 11. A vertical ball screw 13 has its ends freely pivotally borne in the ring plates 10 and 11 and threadably penetrates the intermediate ring plate 9. A timing pulley 14 is fixed at the lower end of the ball screw 13 that extends beyond the stationary ring plate 11 downwardly, and an endless timing belt 16 is wound around the timing pulley 14 and a timing pulley 15 fixed at the end of the output shaft of a DC servomotor M1.

Flexible lead bands 17 are each connected to the lower ends of the two true electrodes 7 (only one of the lead bands 17 is shown in FIG. 1), for providing electric power to the electrodes 7, and are connected at the other ends to a heater power source, not shown. Incidentally, the dummy electrodes 8 are electrically insulated and these dummies function as guide bars as do the true electrodes 7, when the servomotor M1 is started and causes the heater 5 to shift vertically.

The crucible shaft 4 for supporting the crucible assembly slidably penetrates through a horizontal flange fixed at the middle of the bottom of the main chamber 2, and extends vertically outside the main chamber 2. The lower end of the crucible shaft 4 is pivotally supported by a slider 18.

Three vertical guide shafts 20 (of which only one is shown in FIG. 1) extending from the bottom flange of the main chamber 2, slidably penetrate through the slider 18; a vertical ball screw 21 also extending from the bottom flange of the main chamber 2, threadably penetrates through the slider 18. A circular plate 19 is fitted at the lower ends of the guide shafts 20 and the ball screw 21. A timing pulley 22 is fixed at the lower end of the ball screw 21 that extends beyond the plate 19 downwardly, and an endless timing belt 24 is wound around the timing pulley 22 and a timing pulley 23 fixed at the end of the output shaft of a DC servomotor M2. The DC servomotor M2 causes the crucible assembly to shift vertically.

A third DC servomotor M3 is built in the slider 18 for driving the crucible assembly to turn about the central axis. An endless timing belt 27 is passed round the timing pulley 25 fixed about the end of the output shaft of the DC servomotor M3 and the timing pulley 26 fixed at the lower end of the crucible shaft 4, which extends downwardly beyond the slider 18.

A pull chamber 29, comprising a stainless cylinder, is provided on top of the main chamber 2 in a coaxial alignment therewith, and an isolation valve 28 is provided between the two chambers 2, 29. A winder assembly, not shown, is provided at the top portion of the pull chamber. A pull wire 30 is wound round a wire winder drum, not shown, provided in the winder assembly, and a part of it is seen to suspend vertically past the pull chamber 29 and into the main chamber 2. A seed holder 31 is provided at the lower end of the wire 30 for holding a seed crystal 32.

Next, the operation of the single crystal pulling apparatus will be described.

At the beginning of the single crystal pulling operation, the isolation valve 28 is opened to thereby render the main chamber 2 communicate with the pull chamber 29. Then, the air is drawn from these chambers 2, 29, and an inert gas such as argon gas is supplied to them since a single crystal W must be grown in a non-oxidizing atmosphere.

Polycrystal raw material such as silicon is charged in the crucible 3 wherein it is heated and melted down by the heater 5 to form a molten liquid 33. Then, the winder assembly, not shown, is driven to unwind the pull wire 30 from the wire winder drum; thus, the wire 30 is lowered gradually, and the seed crystal 32 fixed at the lower end of the wire 30 is dipped in the molten liquid 33 contained in the crucible 3.

Next, the motor M3 is started, and its torque is transmitted to the crucible support shaft 4 by way of the pulley 25, the timing belt 27, and the pulley 26, whereupon the crucible shaft 4 and the crucible assembly supported thereon are caused to rotate about their common axis of rotation at a predetermined rate CR. Simultaneously with this, the winder assembly, not shown, is driven to cause the wire winder drum to wind up the pull wire 30; thus, the wire 30 is pulled up at a predetermined rate SE. The pull wire 30 is also caused to spin at a predetermined rate of SR by means of the winder assembly. As a result, the pull wire 30 rises and spins at the same time, and a single crystal ingot W grows from the seed crystal 32 provided at the end of the pull wire 30, as shown in FIG. 1.

Incidentally, as the single crystal pulling operation proceeds, the surface level of the molten liquid 33 shifts downward relative to the wall of the crucible 3, and in order to maintain the level of the molten liquid 33 unchanged relative to the chamber 2, the crucible assembly is raised at a predetermined velocity CE. In particular, the motor M2 is started and its torque is transmitted, via the pulley 23, the timing belt 24 and the pulley 22, to the ball screw shaft 21 and causes it to turn in a direction such that the slider 18 is made to ascend along the ball screw shaft 21 and the guide shafts 20, whereby the crucible shaft 4 supported by the slider 18 and the crucible assembly mounted on the crucible shaft 4 rise at the predetermined velocity CE.

In the present embodiment, the heater 5 is also shifted vertically (downwardly) at a predetermined velocity HE during the single crystal pulling operation. In particular, the motor M1 is started and its rotational torque is transmitted, via the pulley 15, the timing belt 16 and the pulley 14, to the ball screw shaft 13 and causes it to turn in a direction such that the ring plate 9 shifts downwardly along the guide shafts 12 and the ball screw shaft 13, whereby the electrodes 7, 7 and the dummy electrodes 8 supported by the ring plate 9 and the heater 5 descend all together at the predetermined velocity of HE.

The single crystal ingot W pulled up as described above, is then brought up into the pull chamber 29, and after the isolation valve 28 is closed to disconnect the communication between the main chamber 2 and the pull chamber 29, the door of the pull chamber 29 is opened and the single crystal ingot W is removed from the single crystal pulling apparatus 1.

In the present embodiment, the cylindrical heater 5 is supported at six points, that is, by the four dummy electrodes 8 and the two true electrodes 7, which are located at regular intervals along the bottom circumference of the heater, i.e., at 60° pitch annularly about the center of the heater 5, so that the deformation of the heater 5 when electrified will be uniform throughout the circumference of the heater 5 and the deformation amount will be decreased. As a result, the distance between the heater 5 and the crucible 3 and that between the heater 5 and the heat shield 6 are maintained uniform throughout of the circumference of the heater 5, the heat distribution in the main chamber 2 becomes more uniform, and the heater 5 would not deform so much as to contact the heat shield 6.

Furthermore, since the deformation amount of the heater 5 is reduced, the heater 5 would wear more slowly, and would be less liable to crack during the assembling and disassembling operations of the single crystal pulling apparatus 1, and hence the life span of the heater 5 becomes longer.

Incidentally, in the above embodiment, the electrodes 7 and dummy electrodes 8 are shifted vertically in one body by means of a single motor M1 and a single ball screw 13; it is also possible to employ a stepping motor for each electrode 7 and dummy electrode 8, and operate each stepping motor in a manner such that the electrodes 7 and dummy electrodes 8 are all shifted in the same direction at the same velocity simultaneously.

Figure 5:
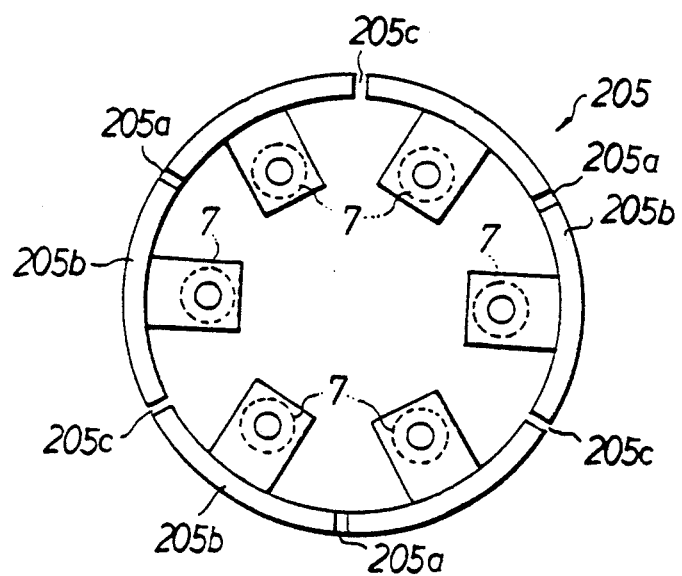
FIG. 5 is a top plan view of a heater of another embodiment of the invention.

It is also possible to design the single crystal pulling apparatus such that the cylindrical heater is composed of more than one heater unit, that is, the cylindrical heater is separated by slicing it vertically into arcuate units; for example, as shown in FIG. 5, it is possible to construct a cylindrical heater 205 with three arcuate heater units 205b each supported at the bottom by one pair of true electrodes 7, (and optionally one or more dummy electrodes); this way it is not necessary to use dummy electrodes to attain the objects of the invention since there are already six vertical electrodes to support the cylindrical composite heater 205. Incidentally, in FIG. 5 the reference numeral 205a designates slits similar to those designated as 5a in FIGS. 2 and 3, and the reference numeral 205c designates vertically penetrating slits to separate the heater 205 into three heater units 205b.

EFFECTS OF THE INVENTION

As is clear from the above description; according to the invention, in a single crystal pulling apparatus wherein a cylindrical heater arranged to encompass a crucible installed in a main chamber is adapted to shift vertically, and supported at the bottom portion thereof by two electrodes which are also vertically shiftable, an improvement is made which lies in that the cylindrical heater is supported by one or more vertical shaft means (dummy and/or true electrodes) in addition to the two existing electrodes, said vertical shaft means being capable of shifting vertically in synchronism with said two electrodes, and being arranged in a manner such that the two electrodes and the vertical shaft means are at regular intervals along the bottom circumference of the cylindrical heater. Furthermore, the number of the shaft means in a probable best mode is four and the two electrodes are arranged to oppose diagonally with each other. With the above improvement, it is now apparent that even in the case of a large-diameter cylindrical heater, the biased deformation of the heater will be restricted by the regularly arranged vertical shafts and the electrodes and the distance between the heater and the crucible and that between the heater and the heat shield are maintained uniform throughout of the circumference of the heater, and furthermore, the heat distribution in the main chamber 2 becomes more uniform, and the heater 5 would not deform so far as to contact the heat shield 6. Since the amount of the deformation of the heater is reduced, the heater does not undergo extensive expansion and shrinkage with the result that the wear of the heater is reduced and its life increased.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A single crystal pulling apparatus of the Czochralski method type wherein a cylindrical heater arranged to encompass a crucible installed in a main chamber is supported at the bottom portion thereof by two vertical electrodes which are vertically and simultaneously shiftable to shift said heater vertically and by one or more vertical shaft means, each said vertical shaft means being one of an additional electrode or an insulated dummy electrode, said vertical shaft means being capable of shifting vertically in synchronism with said two vertical electrodes, and being arranged in a manner such that the two vertical electrodes and the vertical shaft means are located at regular intervals along the bottom circumference of the cylindrical heater.

2. An improved single crystal pulling apparatus as claimed in claim 1 wherein said cylindrical heater consists of a single integral heater unit and said vertical shaft means are all dummy electrodes.

3. An improved single crystal pulling apparatus as claimed in claim 2 wherein said vertical shaft means are four in number and said two electrodes are diagonally opposed to each other.

4. An improved single crystal pulling apparatus as claimed in claim 1 wherein said cylindrical heater is composed of two or more separate arcuate heater units which are separated from neighboring arcuate heater units by vertically penetrating slits, and each heater unit is supported at the bottom portion thereof by at least two vertical rods selected from said two electrodes and said vertical shaft means, two of said at least two vertical rods being electrodes.

5. An improved single crystal pulling apparatus as claimed in claim 4 wherein said cylindrical heater is composed of three separate arcuate heater units, and said vertical shaft means are four in number and all electrodes.

6. An improved single crystal pulling apparatus as claimed in claim 1 wherein said electrodes and said vertical shaft means are interlocked together in a manner such that they are shifted vertically in one body.

7. An improved single crystal pulling apparatus as claimed in claim 2 wherein said electrodes and said vertical shaft means are interlocked together in a manner such that they are shifted vertically in one body.

8. An improved single crystal pulling apparatus as claimed in claim 4 wherein said electrodes and said vertical shaft means are interlocked together in a manner such that they are shifted vertically in one body.

* * * * *